(12) United States Patent
Schricker et al.

(10) Patent No.: US 7,977,667 B2
(45) Date of Patent: Jul. 12, 2011

(54) MEMORY CELL THAT INCLUDES A CARBON NANO-TUBE REVERSIBLE RESISTANCE-SWITCHING ELEMENT AND METHODS OF FORMING THE SAME

(75) Inventors: April D. Schricker, Palo Alto, CA (US); Mark H. Clark, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 98 days.

(21) Appl. No.: 12/421,823

(22) Filed: Apr. 10, 2009

(65) Prior Publication Data
US 2010/0072445 A1   Mar. 25, 2010

Related U.S. Application Data

(60) Provisional application No. 61/044,328, filed on Apr. 11, 2008.

(51) Int. Cl.
*H01L 29/96* (2006.01)
*H01L 21/00* (2006.01)
*G11C 11/00* (2006.01)

(52) U.S. Cl. ......... 257/30; 257/E27.104; 257/E21.663; 438/3; 365/148

(58) Field of Classification Search ...... 438/3; 257/295, 257/30, E27.104, E21.663; 365/148; 977/742, 977/734, 856
See application file for complete search history.

(56) References Cited

U.S. PATENT DOCUMENTS

| | | | |
|---|---|---|---|
| 5,915,167 A | 6/1999 | Leedy | |
| 6,031,287 A | 2/2000 | Harshfield | |
| 6,034,882 A | 3/2000 | Johnson et al. | |
| 6,706,402 B2 | 3/2004 | Rueckes et al. | |
| 6,952,030 B2 | 10/2005 | Herner et al. | |
| 7,038,935 B2* | 5/2006 | Rinerson et al. | 365/148 |
| 7,345,296 B2* | 3/2008 | Tombler et al. | 257/9 |
| 7,348,591 B2* | 3/2008 | Yamauchi et al. | 257/9 |
| 7,405,465 B2 | 7/2008 | Herner | |
| 7,575,984 B2 | 8/2009 | Radigan et al. | |
| 2003/0073295 A1 | 4/2003 | Xu | |

(Continued)

FOREIGN PATENT DOCUMENTS

DE   101 30 824   10/2008

(Continued)

OTHER PUBLICATIONS

International Search Report and Written Opinion of counterpart International Application No. PCT/US2009/040222 mailed Nov. 20, 2009.

(Continued)

*Primary Examiner* — W. David Coleman
(74) *Attorney, Agent, or Firm* — Dugan & Dugan, PC

(57) ABSTRACT

Methods of forming planar carbon nanotube ("CNT") resistivity-switching materials for use in memory cells are provided, that include depositing first dielectric material, patterning the first dielectric material, etching the first dielectric material to form a feature within the first dielectric material, depositing CNT resistivity-switching material over the first dielectric material to fill the feature at least partially with the CNT resistivity-switching material, depositing second dielectric material over the CNT resistivity-switching material, and planarizing the second dielectric material and the CNT resistivity-switching material so as to expose at least a portion of the CNT resistivity-switching material within the feature. Other aspects are also provided.

23 Claims, 15 Drawing Sheets

U.S. PATENT DOCUMENTS

| | | | |
|---|---|---|---|
| 2004/0026730 A1 | 2/2004 | Kostylev et al. | |
| 2004/0251551 A1 | 12/2004 | Hideki | |
| 2006/0022347 A1 | 2/2006 | Campbell | |
| 2006/0158760 A1* | 7/2006 | Portico Ambrosio et al. | 359/883 |
| 2006/0250836 A1 | 11/2006 | Herner et al. | |
| 2006/0263289 A1 | 11/2006 | Heo et al. | |
| 2007/0045691 A1* | 3/2007 | Chang et al. | 257/295 |
| 2007/0069217 A1 | 3/2007 | Herner | |
| 2007/0087508 A1 | 4/2007 | Herner | |
| 2007/0158697 A1* | 7/2007 | Choi et al. | 257/246 |
| 2007/0190722 A1 | 8/2007 | Herner | |
| 2007/0205792 A1 | 9/2007 | Mouli et al. | |
| 2008/0002481 A1 | 1/2008 | Gogl et al. | |
| 2008/0070162 A1 | 3/2008 | Ufert | |
| 2008/0169531 A1 | 7/2008 | Huo et al. | |
| 2008/0211101 A1* | 9/2008 | Han et al. | 257/752 |
| 2008/0217732 A1 | 9/2008 | Kreupl | |
| 2008/0283813 A1 | 11/2008 | Jeong | |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |
| 2009/0256130 A1 | 10/2009 | Schricker | |
| 2009/0256131 A1 | 10/2009 | Schricker | |
| 2009/0257270 A1* | 10/2009 | Schricker et al. | 365/148 |

FOREIGN PATENT DOCUMENTS

| | | |
|---|---|---|
| EP | 1 892 722 A1 | 2/2008 |
| JP | 2008 078509 A | 4/2008 |
| WO | WO 2008/021900 A | 2/2008 |
| WO | WO 2009/064842 A1 | 5/2009 |

OTHER PUBLICATIONS

Xu et al., U.S. Appl. No. 12/505,122, filed Jul. 17, 2009.
Xu et al., U.S. Appl. No. 12/465,315, filed May 13, 2009.
Xu et al., U.S. Appl. No. 12/499,467, filed Jul. 8, 2009.
Schricker et al., U.S. Appl. No. 12/421,405, filed Apr. 9, 2009.
Malhi et al., "Characteristics and Three-Dimensional Integration of MOSFET's in Small-Grain LPCVD Polycrystalline Silicon," IEEE Journal of Solid-State Circuits, vol. SC-20, No. 1, Feb. 1985, pp. 178-201.
Scheuerlein et al., U.S. Appl. No. 12/418,855, filed Apr. 6, 2009.
Chen et al., "Effects of deposition temperature on the properties of hermetically carbon-coated optical fibers prepared by thermal chemical vapor deposition," Surface and Coatings Technology, vol. 202, Issues 4-7, Dec. 15, 2007, pp. 798-803.
Son et al., "Electrical Switching in Metallic Carbon Nanotubes," Physical Review Letters, vol. 95, Issue 21, id 216602, 2005, pp. 1-4.
Li et al., "Bottom-up approach for carbon nanotube interconnects," Applied Physics Letters, vol. 82, No. 15, Apr. 14, 2003, pp. 2491-2493.
Communication pursuant to Article 94(3) EPC in counterpart European Patent Application 09743209.0 dated Mar. 3, 2011.

* cited by examiner

MEMORY CELL THAT INCLUDES A CARBON NANO-TUBE REVERSIBLE RESISTANCE-SWITCHING ELEMENT AND METHODS OF FORMING THE SAME

REFERENCE TO RELATED APPLICATIONS

This application claims the benefit of U.S. Provisional Patent Application Ser. No. 61/044,328, filed Apr. 11, 2008, and titled "Damascene Integration Methods For Carbon Nano-Tube Films In Non-Volatile Memories And Memories Formed Therefrom," which is hereby incorporated by reference herein in its entirety for all purposes.

BACKGROUND

The present invention relates to non-volatile memories and more particularly to a memory cell that includes a carbon nano-tube reversible resistance-switching element and methods of forming the same.

Non-volatile memories formed from carbon nano-tube ("CNT") materials are known. For example, U.S. patent application Ser. No. 11/968,156, filed Dec. 31, 2007 and titled "Memory Cell That Employs A Selectively Fabricated Carbon Nano-Tube Reversible Resistance-Switching Element Formed Over A Bottom Conductor And Methods Of Forming The Same" (the "'156 Application"), which is hereby incorporated by reference herein in its entirety for all purposes, describes a rewriteable non-volatile memory cell that includes a diode coupled in series with a reversible resistivity-switching element formed from CNT material.

However, fabricating memory devices from CNT materials is technically challenging, and improved methods of forming memory devices that employ CNT materials are desirable.

SUMMARY

In accordance with a first aspect of the invention, a method of forming a planar CNT resistivity-switching material for use in a memory cell is provided, the method including: (1) depositing first dielectric material, (2) patterning the first dielectric material, (3) etching the first dielectric material to form a feature within the first dielectric material, (4) depositing CNT resistivity-switching material over the first dielectric material to fill the feature at least partially with the CNT resistivity-switching material, (5) depositing second dielectric material over the CNT resistivity-switching material, and (6) planarizing the second dielectric material and the CNT resistivity-switching material so as to expose at least a portion of the CNT resistivity-switching material within the feature.

In accordance with a second aspect of the invention, a method of forming a memory cell is provided, the method including: (1) forming a feature above a substrate, (2) forming a memory element comprising CNT resistivity-switching material by (a) forming CNT resistivity-switching material in the feature, wherein a surface of the CNT resistivity-switching material comprises a void or valley, and (b) forming a dielectric material above the CNT resistivity-switching material, wherein the dielectric material substantially fills the void or valley, and (3) forming a steering element above the substrate, wherein the steering element is coupled to the CNT resistivity-switching material.

In accordance with a third aspect of the invention, a memory cell is provided that includes: (1) a feature above a substrate, (2) a CNT resistivity-switching material in the feature, wherein a surface of the CNT resistivity-switching material comprises a void or valley, (3) a dielectric material above the CNT resistivity-switching material, wherein the dielectric material substantially fills the void or valley, and (4) a steering element above the substrate, wherein the steering element is coupled to the CNT resistivity-switching material.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Some CNT materials have been shown to exhibit reversible resistivity-switching properties that may be suitable for use in non-volatile memories. However, when CNT material is used in forming a memory cell, the deposited or grown CNT material often has a rough surface topography, with pronounced thickness variations, such as numerous peaks and valleys. The rough surface topography of CNT material can cause difficulties in forming a memory cell. For example, the rough surface topography of CNT material can make CNT materials difficult to etch without excessive etching of the underlying substrate, increasing fabrication costs and complexity associated with their use in integrated circuits. In addition, voids in the surface of CNT material can be penetrated by conductive material deposited above the CNT material and cause vertical short circuits to occur. Although peaks on the surface of CNT material can be removed by planarization, any valleys, or voids, that remain after planarization may hinder the fabrication of the memory cells.

Exemplary methods in accordance with this invention form a memory cell that includes a memory element formed from CNT material. In particular, exemplary methods in accordance with this invention form a memory cell by forming a first layer of dielectric material, patterning and etching the first dielectric layer to form a feature, such as a via or a trench, within the first dielectric layer, forming CNT material in the feature, forming a second layer of dielectric material over the CNT material to fill voids in the surface of the CNT material, and planarizing the second dielectric layer and the CNT material to expose at least a portion of the CNT material within the feature. In this manner, the CNT material need not be etched.

The CNT material may include a CNT reversible resistivity-switching material, for example, and be used to form a reversible resistance switching element. A steering element such as a diode may be formed and coupled to the CNT material.

In at least some embodiments, the CNT material is formed by spray- or spin-coating a CNT suspension over the first dielectric layer and in the feature, creating random CNT material. Forming CNT material using a spray-coating technique, and forming CNT material using a spin-coating technique, are known. In alternative exemplary embodiments, CNT material is selectively grown on a CNT seeding layer formed in the feature by chemical vapor deposition ("CVD"), plasma-enhanced CVD ("PECVD"), laser vaporization, electric arc discharge or the like.

Exemplary Inventive Memory Cell

Figure 1:
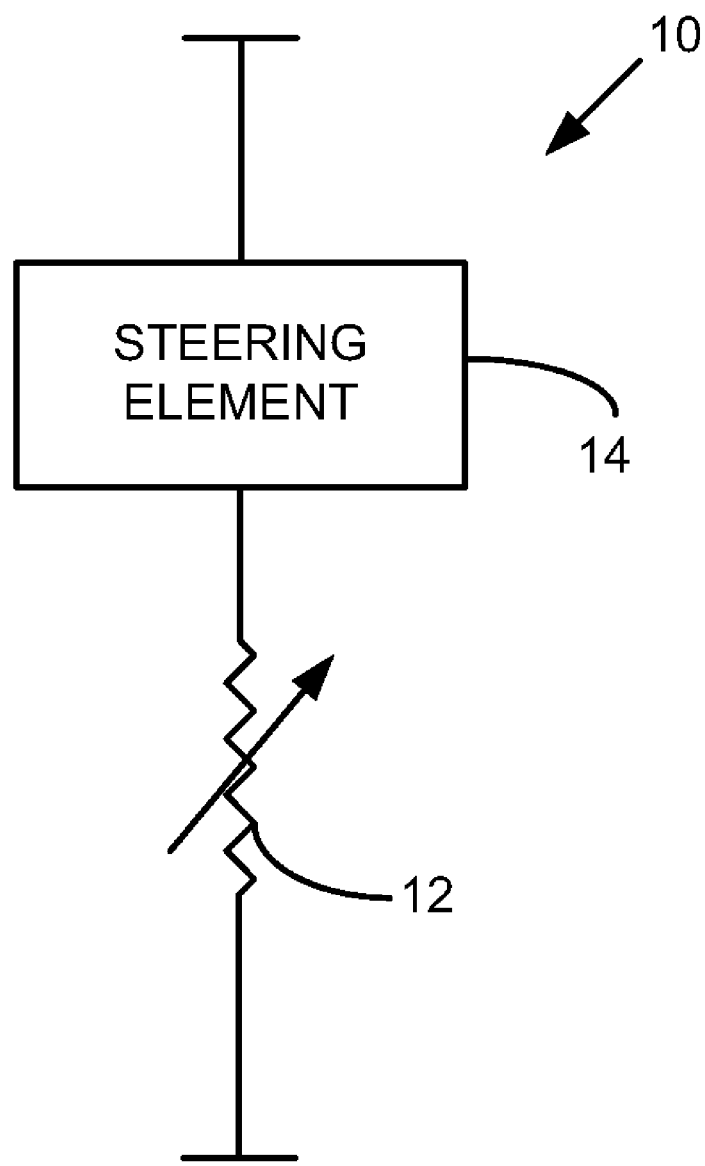
FIG. 1 is a diagram of an exemplary memory cell in accordance with this invention.

FIG. 1 is a schematic illustration of an exemplary memory cell 10 provided in accordance with the present invention. Memory cell 10 includes a reversible resistance-switching element 12 coupled to a steering element 14.

Reversible resistance-switching element 12 includes a reversible resistivity-switching material (not separately shown) having a resistivity that may be reversibly switched between two or more states. For example, the reversible resistivity-switching material of element 12 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity-switching materials and operation of memory cells employing reversible resistance-switching elements are described in, for example, U.S. patent application Ser. No. 11/125,939, filed May 9, 2005 and titled "Rewriteable Memory Cell Comprising A Diode And A Resistance-Switching Material" (the "'939 Application"), which is hereby incorporated by reference herein in its entirety for all purposes.

In at least some embodiments of this invention, reversible resistance-switching element 12 is formed using a CNT material deposited or grown using a damascene integration technique. As will be described further below, use of a damascene integration technique to form the CNT material eliminates the need to etch the CNT material. Fabrication of reversible resistance-switching element 12 thereby is simplified.

Steering element 14 may include a thin film transistor, a diode, or another suitable steering element that exhibits nonohmic conduction by selectively limiting the voltage across and/or the current flow through reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance-switching element 12 and steering element 14 are described below with reference to FIGS. 2A-3.

Exemplary Embodiment of a Memory Cell

Figure 2A:
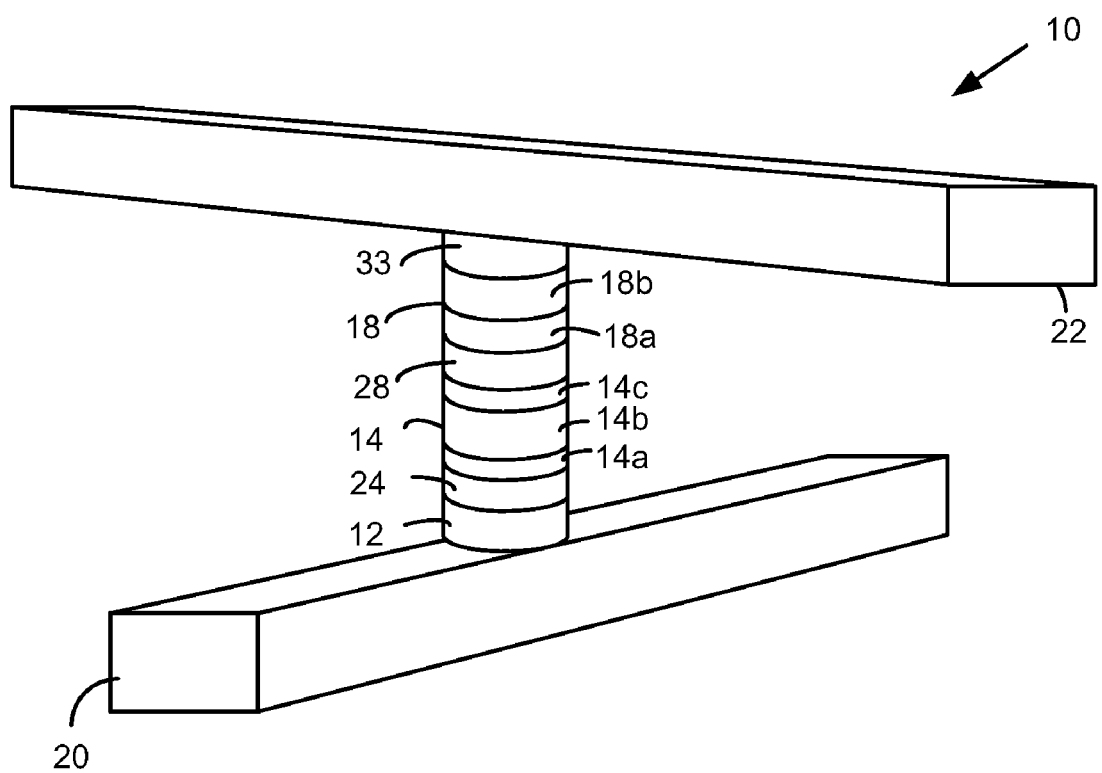
FIG. 2A is a simplified perspective view of an exemplary memory cell in accordance with this invention.

FIG. 2A is a simplified perspective view of an exemplary memory cell 10 in accordance with this invention. Memory cell 10 includes reversible resistance-switching element 12 coupled in series with a diode 14 between a first conductor 20 and a second conductor 22. Memory cell 10 also includes a region 18 which may serve as a metal hard mask during fabrication. In some embodiments, a barrier layer 24 may be formed between reversible resistance-switching element 12 and diode 14. In addition, in some embodiments, a barrier layer 28 may be formed between diode 14 and hard mask region 18, and a barrier layer 33 may be formed between hard mask region 18 and second conductor 22. Barrier layers 24, 28, and 33 may include titanium nitride, tantalum nitride, tungsten nitride, etc., or other suitable barrier layer.

Reversible resistance switching element 12 may include a carbon-based material (not separately shown) having a resistivity that may be reversibly switched between two or more states. In the embodiment of FIG. 2A, reversible resistance switching element 12 includes a CNT rewriteable resistivity-switching material. In some embodiments, only a portion, such as one or more filaments, of the CNT material that forms reversible resistance-switching element 12 may switch and/or be switchable.

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed. Exemplary embodiments of diode 14 are described below with reference to FIG. 3.

In some embodiments, hard mask region 18 may include a first metal layer 18a which may include titanium nitride, tantalum nitride, tungsten nitride, etc., and a second metal layer 18b which may include tungsten, for example. As will be described further below, hard mask layers 18a and 18b may serve as a hard mask during formation of diode 14. Use of metal hard masks is described, for example, in U.S. patent application Ser. No. 11/444,936, filed May 13, 2006 and titled "Conductive Hard Mask To Protect Patterned Features During Trench Etch" (the "'936 Application"), which is hereby incorporated by reference herein in its entirety for all purposes.

First and/or second conductor 20, 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20, 22 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first and/or second conductors 20, 22 to improve device performance and/or aid in device fabrication.

Figure 2B:
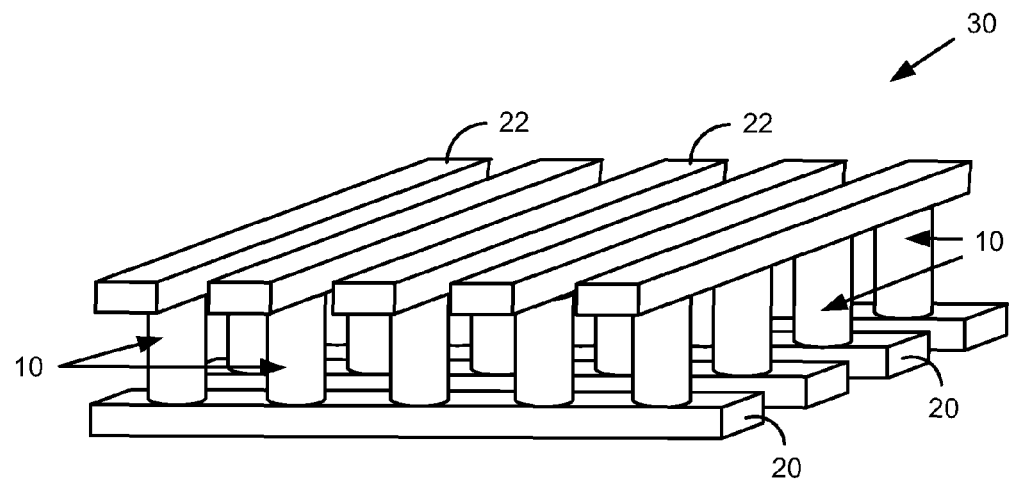
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cell 10 of FIG. 2A. For simplicity, reversible resistance switching element 12, diode 14, and barrier layers 24, 28 and 33 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
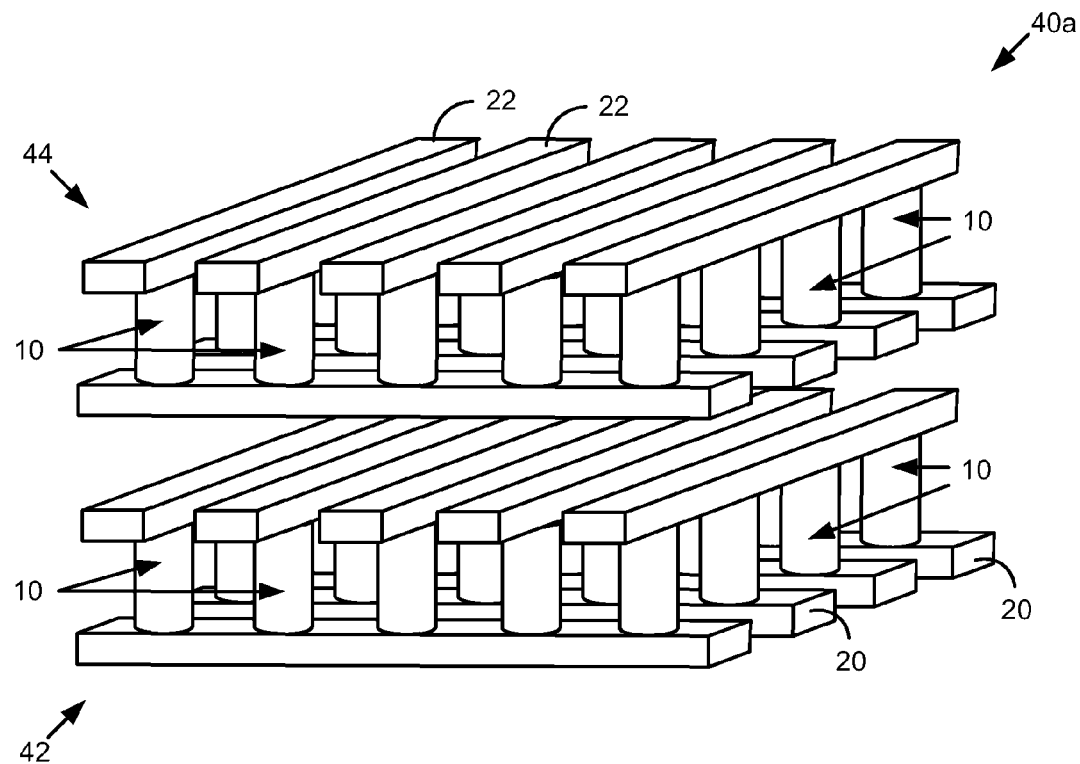
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
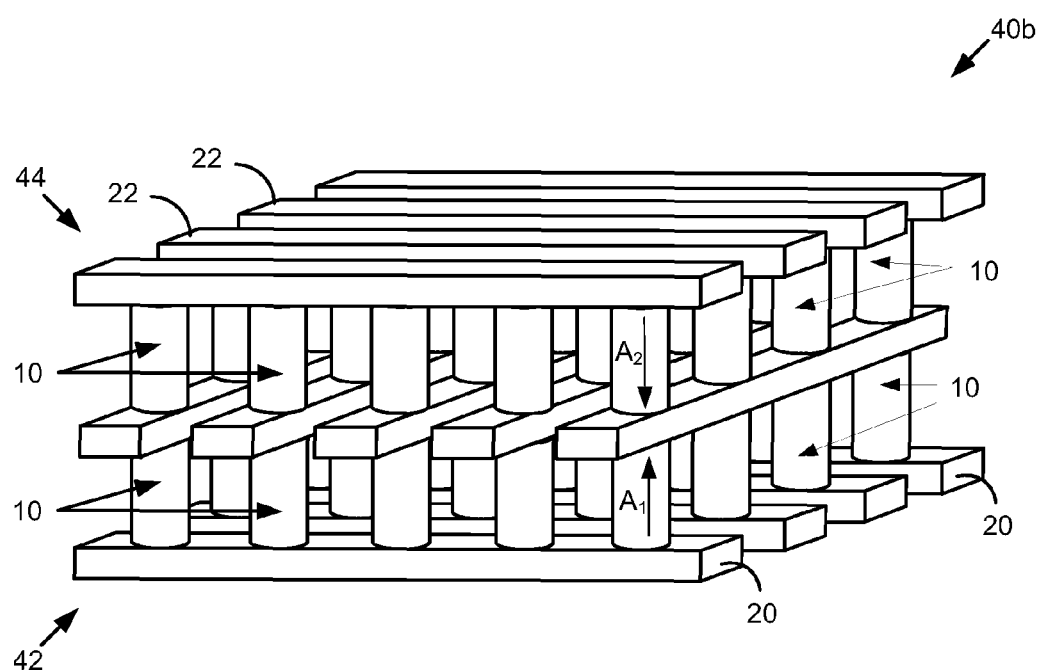
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in the alternative exemplary three dimensional array 40b illustrated in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in FIG. 2D, the diodes of the first memory level 42 may be upward pointing diodes as indicated by arrow A1 (e.g., with p regions at the bottom of the diodes), whereas the diodes of the second memory level 44 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
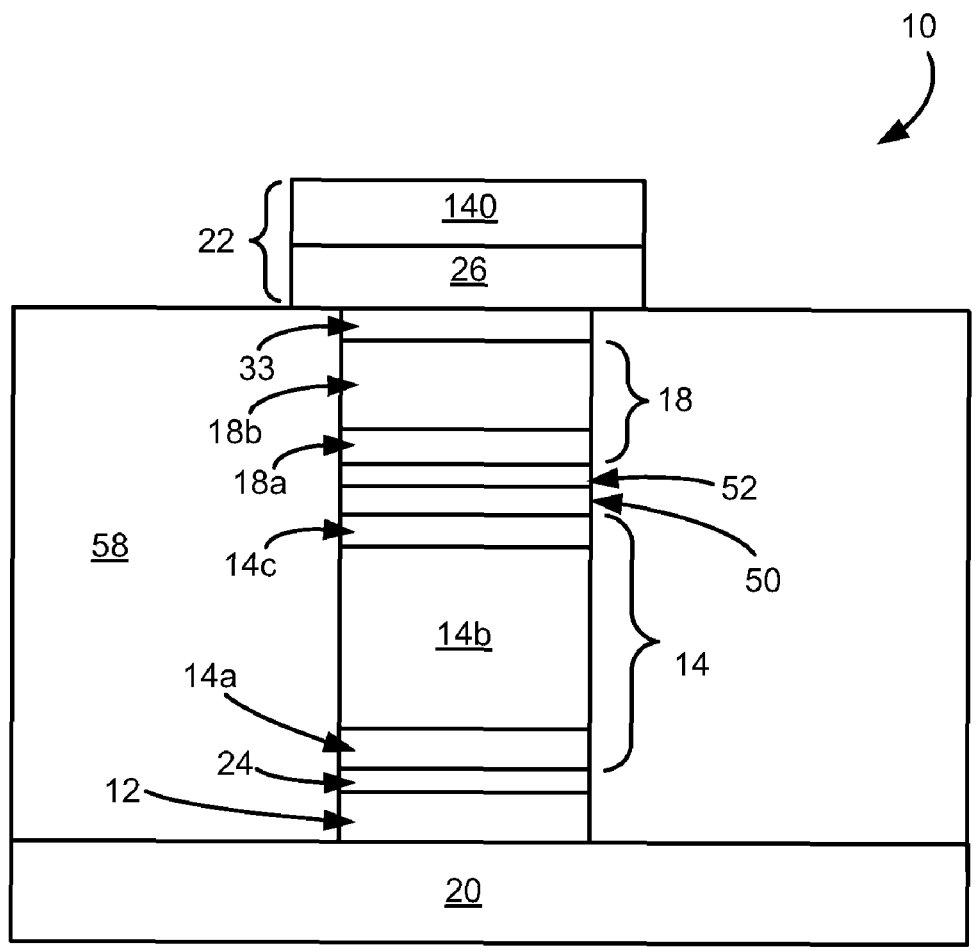
FIG. 3 is a cross-sectional view of an exemplary embodiment of a memory cell in accordance with this invention.

FIG. 3 is a cross-sectional view of an exemplary embodiment of memory cell 10 of FIG. 2A. Memory cell 10 includes reversible resistance-switching element 12, diode 14 and first and second conductors 20, 22. Reversible resistance-switching element 12 includes CNTs formed using a damascene integration technique, described in more detail below.

Diode 14 is formed above reversible resistance switching element 12. As stated, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

If diode 14 is formed from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10, as a large voltage is not required to switch the deposited silicon to a low resistivity state. For example, a silicide-forming metal layer 52 such as titanium or cobalt may be deposited on p+ polysilicon region 14c. During a subsequent anneal step (described below) employed to crystallize the deposited silicon that forms diode 14, silicide-forming metal layer 52 and the deposited silicon of diode 14 interact to form silicide layer 50, consuming all or a portion of silicide-forming metal layer 52.

In at least some embodiments, a metal hard mask region 18 may be formed over silicide-forming metal layer 52. For example, a barrier layer 18a and/or a conductive layer 18b may be formed over silicide-forming metal layer 52. Barrier layer 18a may include titanium nitride, tantalum nitride, tungsten nitride, etc., and conductive layer 18b may include tungsten or another suitable metal layer.

As will be described further below, barrier layer 18a and/or conductive layer 18b may serve as a hard mask during formation of diode 14 and may mitigate any overetching that may occur during formation of top conductor 22 (as described in the '936 Application, previously incorporated). For example, barrier layer 18a and conductive layer 18b may be patterned and etched, and then serve as a mask during etching of diode 14.

Barrier layer 33 is formed over hard mask region 18. Barrier layer 33 may include titanium nitride, tantalum nitride, tungsten nitride, etc., or other suitable material.

Second conductor 22 is formed above barrier layer 33. In some embodiments, second conductor 22 may include one or more barrier layers and/or adhesion layers 26 and a conductive layer 140.

Exemplary Fabrication Process for a Memory Cell

FIGS. 4A-4K illustrate cross sectional views of a portion of a substrate 100 during fabrication of a first memory level in accordance with the present invention. As will be described below, the first memory level includes a plurality of memory cells that each include a reversible resistance-switching element formed by selectively fabricating CNT material above a substrate. Additional memory levels may be fabricated above the first memory level (as described previously with reference to FIGS. 2C-2D).

Figure 4A:
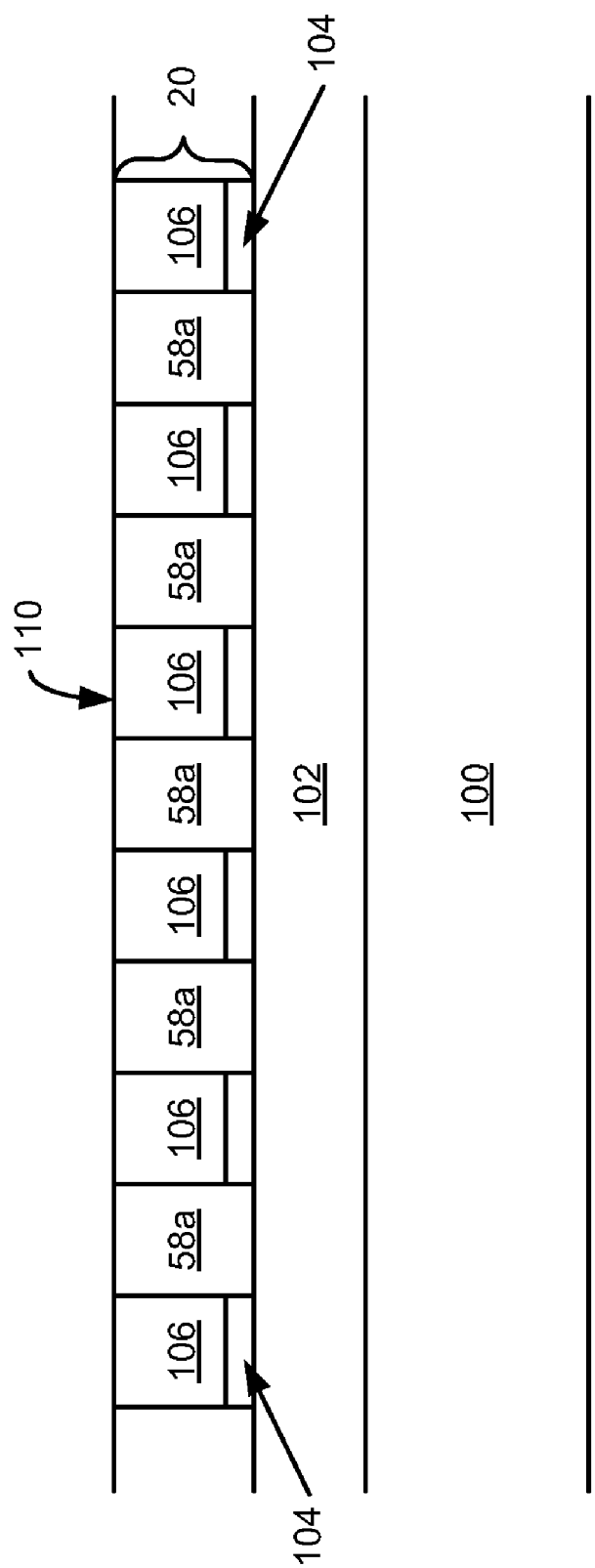
FIGS. 4A-4J illustrate cross-sectional views of a portion of a substrate during an exemplary fabrication of a single memory level in accordance with this invention.

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOT") or other substrate with or without additional circuitry. For example, substrate 100 may include one or more n-well or p-well regions (not shown).

An isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition ("PVD") or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar conductors 20 (as shown in FIG. 4A). Exemplary widths for conductors 20 and/or spacings between conductors 20 range from about 200 to about 2500 angstroms, although other conductor widths and/or spacings may be used.

After conductors 20 have been formed, a dielectric layer 58a is formed over substrate 100 to fill the voids between the conductors 20, as shown in FIG. 4A. For example, approximately 3000-7000 angstroms of silicon dioxide may be deposited on substrate 100 and planarized using chemical mechanical polishing ("CMP") or an etchback process to form a planar surface 110. Planar surface 100 includes exposed top surfaces of conductors 20 separated by dielectric material 58a (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, conductors 20 may be formed using a damascene process in which dielectric layer 58a is formed, patterned and etched to create openings or voids for conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
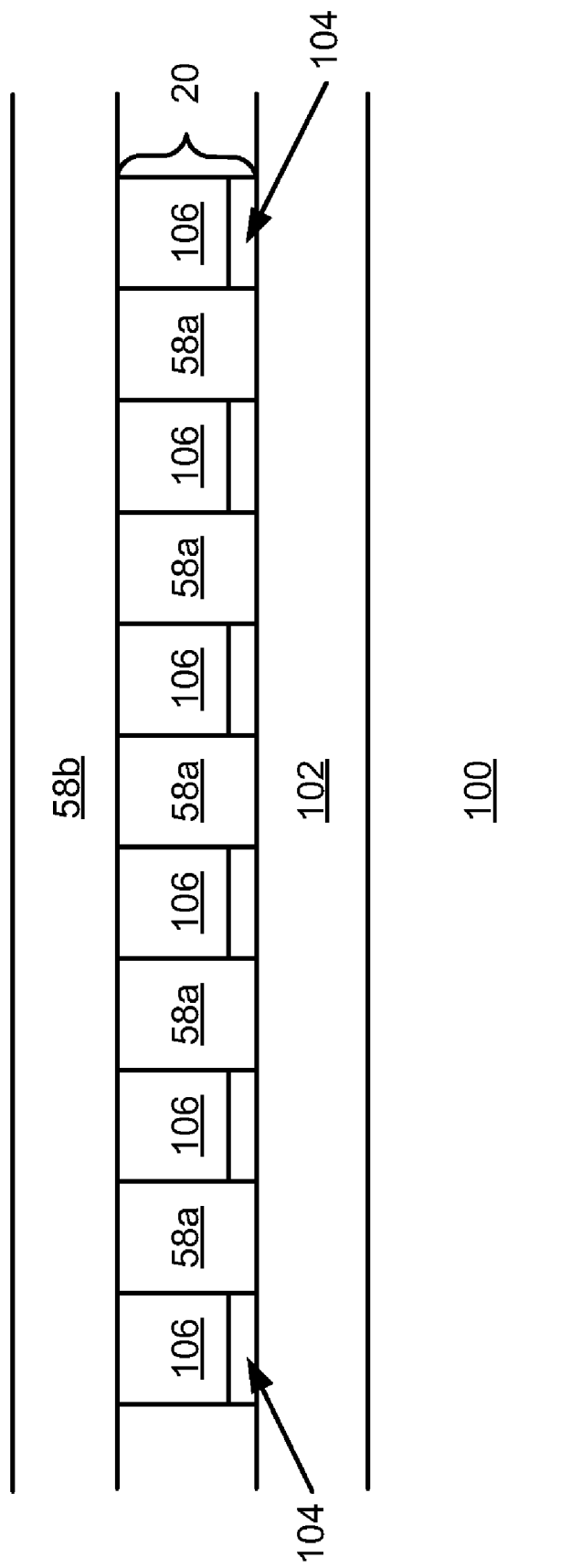

Following planarization, reversible resistance switching element 12 is formed using a damascene integration technique. In particular, a dielectric layer 58b is formed above planar surface 110, as shown in FIG. 4B. For example, approximately 200 angstroms to 1 micron of silicon dioxide may be deposited above substrate 100 to form dielectric layer 58b. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4C:
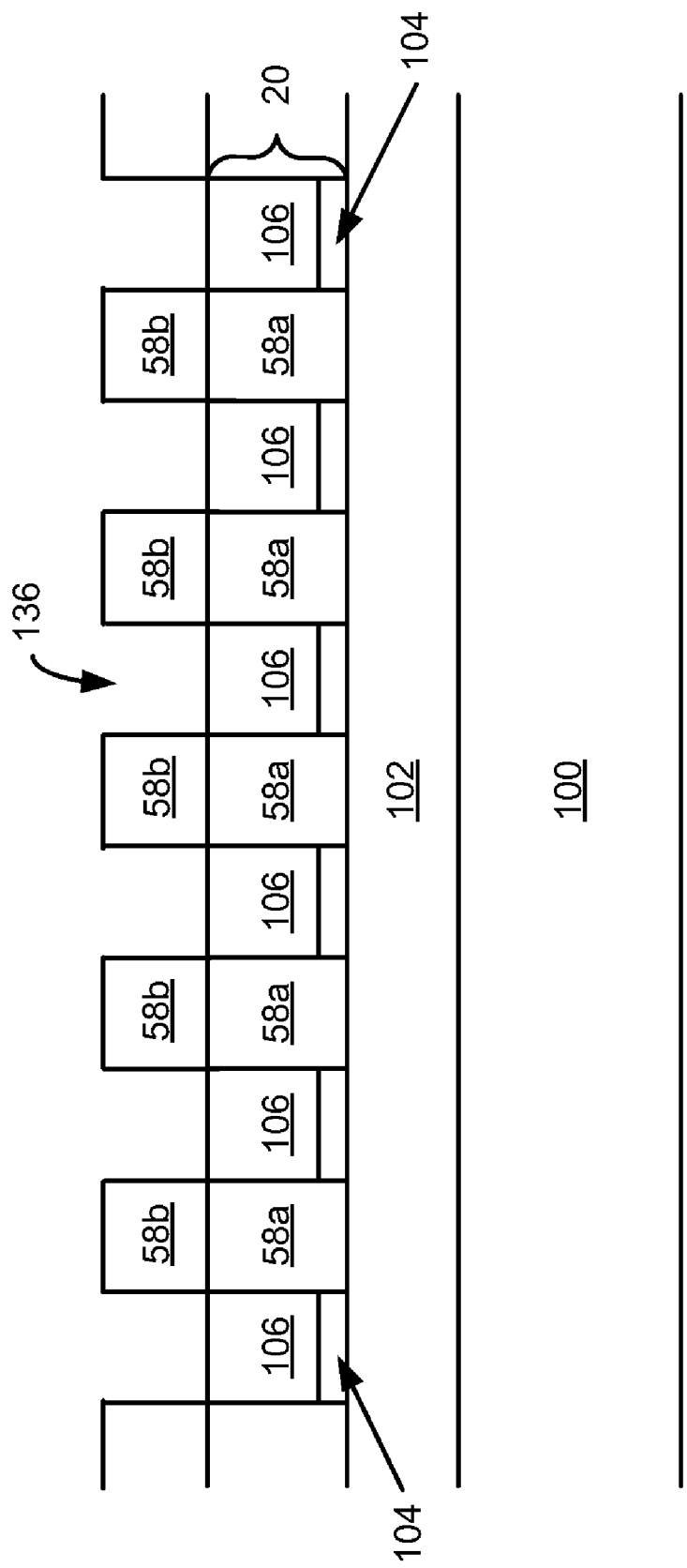

With reference to FIG. 4C, dielectric layer 58b is patterned and etched to create features 136. Any suitable method may be used to form features 136. In at least one embodiment, a layer of photoresist (not shown) is deposited on dielectric layer 58b, and a mask is used to pattern the photoresist on top of dielectric layer 58b. The patterned photoresist is developed to create an opening (e.g., a trench) in the photoresist, through which dielectric layer 58b is etched until the underlying conductor 20 is exposed. The photoresist is then removed, leaving dielectric material 58b and features 136.

Figure 4D:
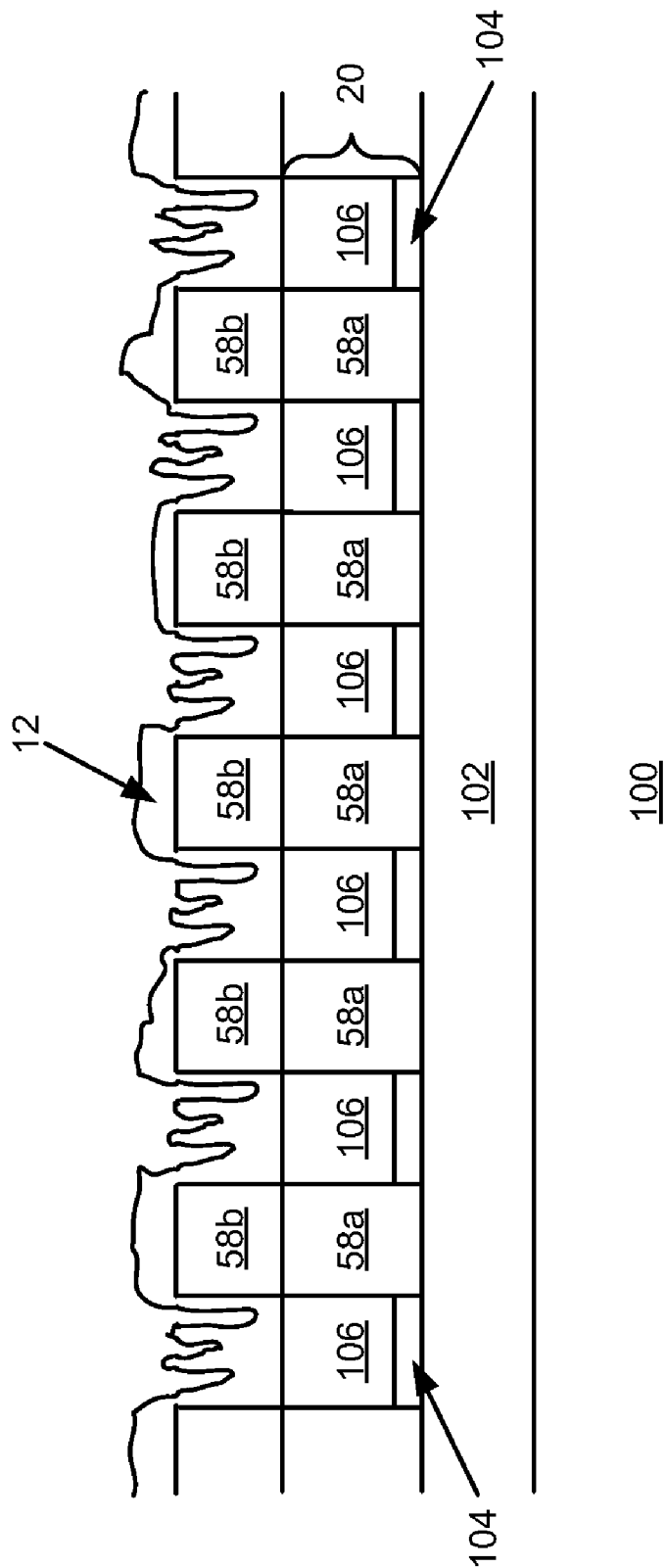

With reference to FIG. 4D, a reversible resistance-switching element 12 is created by forming CNTs above dielectric layer 58b and at least partially within features 136. In the remaining discussion, reversible resistance-switching element 12 will also be referred to as CNT layer 12.

CNT layer 12 may be formed by any suitable method. In some embodiments, CNT layer 12 may be formed by depositing a CNT seeding layer (not shown) on the bottom of features 136, and selectively fabricating CNT material on the CNT seeding layer. The CNT seeding layer may be a layer that facilitates CNT formation, such as a single layer of roughened metal nitride, such as surface roughened titanium or tantalum nitride, a multi-layer structure formed from a smooth or surface roughened metal nitride coated with a metal catalyst, a single layer of a metal catalyst such as nickel, cobalt, iron, etc., or a non-metal silicon-germanium seed layer. As used herein, silicon-germanium, or "Si/Ge," refers to a deposited or otherwise formed material including any ratio of silicon ("Si") to germanium ("Ge") or of a layered laminate of thin films or nanoparticle islands including Si-rich and Ge-rich layers in any order. Exemplary techniques for selectively fabricating CNT material on CNT seeding layers are described in U.S. patent application Ser. No. 12/410,771, filed Mar. 25, 2009, and titled "Memory Cell That Employs A Selectively Fabricated Carbon Nano-Tube Reversible Resistance-Switching Element, And Methods Of Forming The Same," U.S. patent application Ser. No. 12/410,789, filed Mar. 25, 2009, and titled "Memory Cell That Employs A Selectively Fabricated Carbon Nano-Tube Reversible Resistance-Switching Element Formed Over A Bottom Conductor And Methods Of Forming The Same," U.S. patent application Ser. No. 11/968,156, filed Dec. 31, 2007 and titled "Memory Cell That Employs A Selectively Fabricated Carbon Nano-Tube Reversible Resistance-Switching Element Formed On A Bottom Conductor And Methods Of Forming The Same." U.S. patent application Ser. No. 11/968,159, filed Dec. 31, 2007 and titled "Memory Cell With Planarized Carbon Nanotube Layer And Methods Of Forming The Same," and U.S. patent application Ser. No. 11/968,154, filed Dec. 31, 2007 and titled "Memory Cell That Employs A Selectively Fabricated Carbon Nano-Tube Reversible Resistance-Switching Element And Methods Of Forming The Same," each of which is incorporated by reference herein in their entireties for all purposes.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% Argon at a pressure of about 5.5 Torr for about 20 minutes. Other temperatures, gases, ratios, pressures and/or growth times may be used.

In yet another embodiment, CNTs may be formed on a metal catalyst seeding layer such as nickel, cobalt, iron, etc., using PECVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

In still another embodiment, CNTs may be formed on a Si/Ge seeding layer using CVD or PECVD. To grow CNTs using the carbon implanted Si/Ge seeds, a CVD technique may be used with approximately 850° C. for approximately 10 minutes using methane diluted with $H_2$ gas. Other carbon precursors might be used to form CNTs as well. Any other suitable CNT formation techniques and/or processing conditions may be used.

In alternative embodiments, CNT layer 12 may be formed spray-coating or spin-coating a CNT suspension over dielectric layer 58b. For example, techniques for forming CNT material using spray-coating or spin-coating techniques are described in Rueckes et al. U.S. Pat. No. 6,706,402, titled "Nanotube Films And Articles," which is incorporated by reference herein in its entirety for all purposes.

In some embodiments, CNT layer 12 may have a thickness of about 1 nanometer to about 1 micron (and even tens of microns), and more preferably about 10 to about 20 nanometers, although other CNT material thicknesses may be used. The density of the individual tubes in CNT layer 12 may be, for example, about $6.6 \times 10^3$ to about $1 \times 10^6$ CNTs/micron$^2$, and more preferably at least about $6.6 \times 10^4$ CNTs/micron$^2$, although other densities may be used. For example, it is preferred to have at least about 10 CNTs, and more preferably at least about 100 CNTs, in CNT layer 12 (although fewer CNTs, such as 1, 2, 3, 4, 5, etc., or more CNTs, such as more than 100, may be employed).

To improve the reversible resistivity-switching characteristics of CNT layer 12, in some embodiments it may be preferable that at least about 50%, and more preferably at least about ⅔, of the carbon nano-tubes of CNT layer 12 are semiconducting. Multiple wall CNTs are generally metallic, whereas single wall CNTs may be metallic or semiconducting. In one or more embodiments, it may be preferable for CNT layer 12 to include primarily semiconducting single wall CNTs. In other embodiments, fewer than 50% of the CNTs of CNT layer 12 may be semiconducting.

Vertically aligned CNTs allow vertical current flow with little or no lateral conduction. To prevent the formation of lateral or bridging conduction paths between adjacent memory cells, in some embodiments, the individual tubes of CNT layer 12 may be fabricated to be substantially vertically aligned (e.g., thereby reducing and/or preventing the state of a memory cell from being influenced or "disturbed" by the state and/or programming of adjacent memory cells). Note that this vertical alignment may or may not extend over the entire thickness of CNT layer 12. For example, during the initial growth phase, some or most of the individual tubes may be vertical aligned (e.g., not touching). However, as the individual tubes increase in length vertically, portions of the tubes may come in contact with one another, and even become entangled or entwined.

In some embodiments, defects may be intentionally created in the CNT material to improve or otherwise tune the reversible resistivity-switching characteristics of the CNT material. For example, after CNT material layer 12 has been formed, argon, nitrogen, O$_2$ or another species may be implanted into the CNT material to create defects in the CNT material. In a second example, the CNT material may be subjected or exposed to an argon, chlorine, nitrogen or O$_2$ plasma (biased or chemical) to intentionally create defects in the CNT material.

In some embodiments in accordance with this invention, following formation of CNT layer 12, an anneal step may be performed prior to depositing dielectric material. In particular, the anneal may be performed in a vacuum or the presence of one or more forming gases, at a temperature in the range from about 350° C. to about 900° C., for about 30 to about 180 minutes. The anneal preferably is performed in about an 80%(N$_2$):20%(H$_2$) mixture of forming gases, at about 625° C. for about one hour.

Suitable forming gases may include one or more of N$_2$, Ar, and H$_2$, whereas preferred forming gases may include a mixture having above about 75% N$_2$ or Ar and below about 25% H$_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760 T, whereas preferred pressures may range from about 300 mT to about 600 mT.

A queue time of preferably about 2 hours between the anneal and the dielectric deposition preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that CNT material may absorb water from the air over time. Likewise, it is believed that the moisture may increase the likelihood of de-lamination of the CNT material. In some cases, it also might be acceptable to have a queue time of 2 hours from the time of CNT growth to dielectric deposition, skipping the anneal altogether.

Incorporation of such a post-CNT-formation-anneal preferably takes into account other layers present on the device that includes the CNT material, because these other layers will also be subject to the anneal. For example, the anneal may be omitted or its parameters may be adjusted where the aforementioned preferred anneal parameters would damage the other layers. The anneal parameters may be adjusted within ranges that result in the removal of moisture without damaging the layers of the annealed device. For instance, the temperature may be adjusted to stay within an overall thermal budget of a device being formed. Likewise, any suitable forming gases, temperatures and/or durations may be used that are appropriate for a particular device. In general, such an anneal may be used with any carbon-based layer or carbon-containing material, such as layers having CNT material, graphite, graphene, amorphous carbon, etc.

As previously discussed, CNT material often has a rough surface topography, with pronounced thickness variations, such as numerous peaks, as well as valleys, or voids. As a result, CNT material can be difficult to etch. In addition, if a conductive material such as titanium nitride is deposited above the CNT material, the conductive material may penetrate voids in the surface of the CNT material and cause vertical short circuits to occur between the conductive material and a conductor under the CNT material. Although peaks on the surface of CNT material can be removed by planarization, any valleys, or voids, that remain after planarization may hinder the fabrication of the memory cells.

Figure 4E:
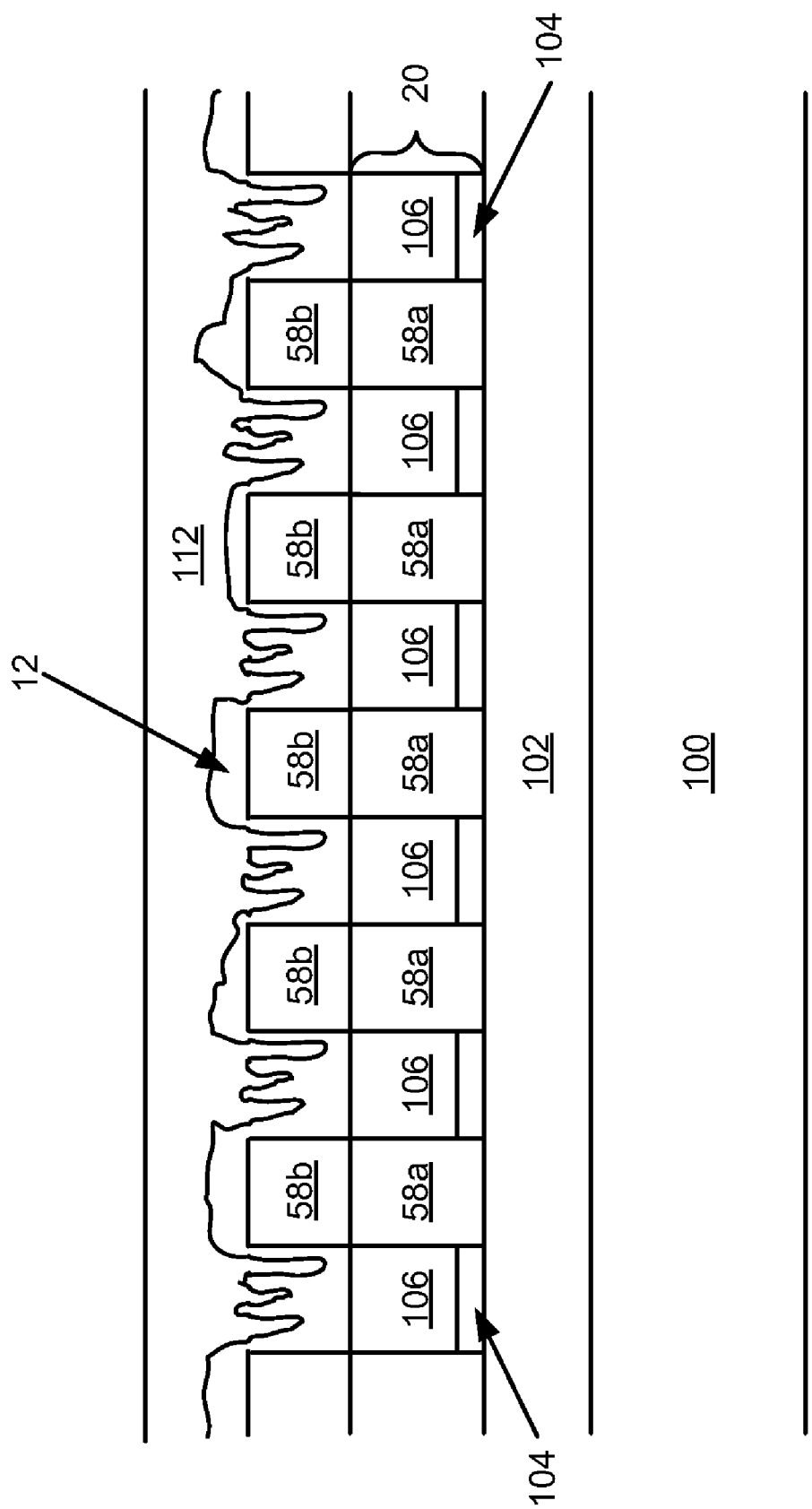

Accordingly, in accordance with this invention, a dielectric layer 112 is deposited on top of CNT layer, as shown in FIG. 4E. For example, approximately 100 to 1200 angstroms, and in some embodiments a micron or more, of silicon dioxide may be deposited. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4F:
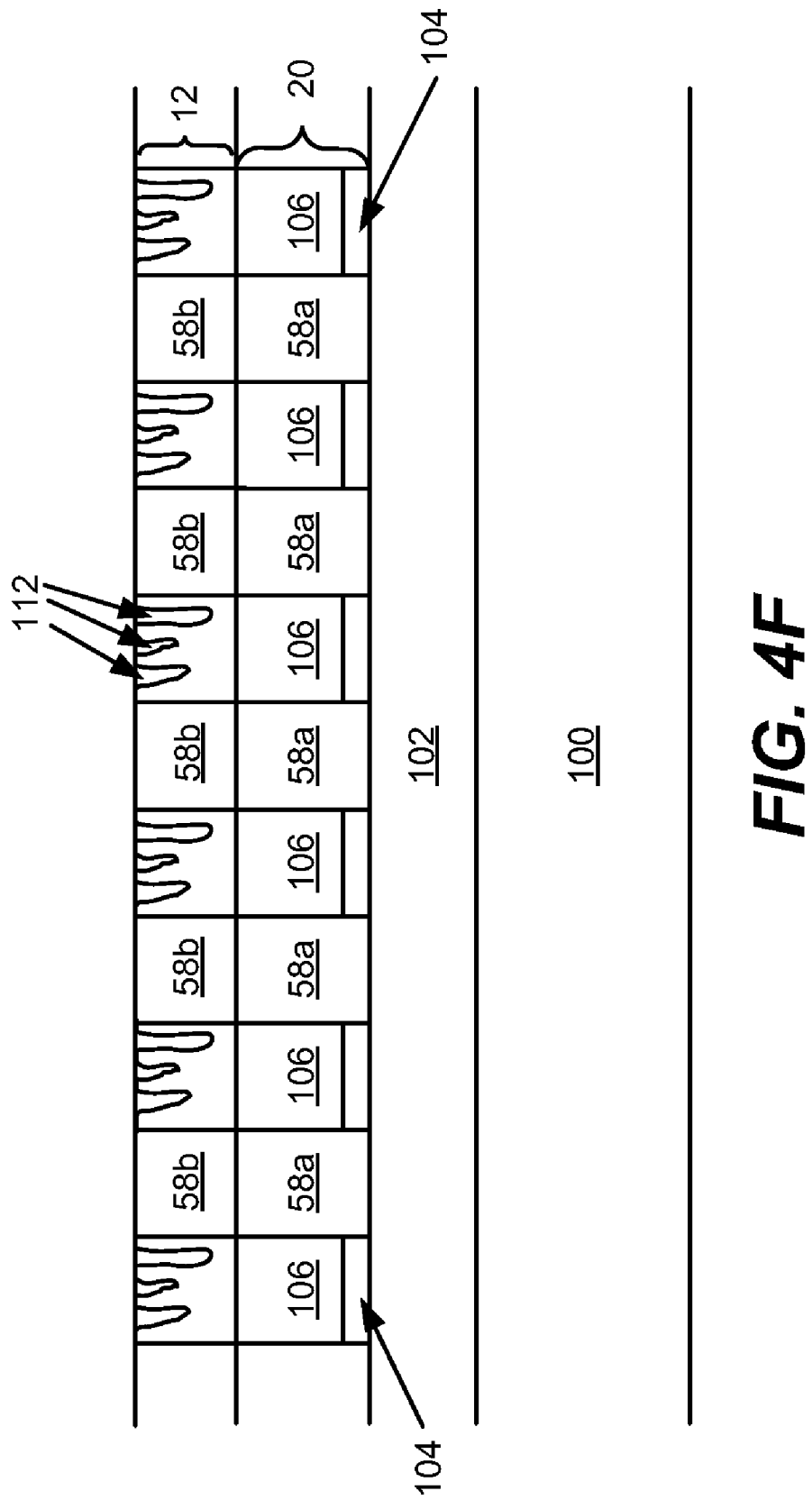

Dielectric layer 112 covers CNT layer 12 and substantially fills exposed voids in CNT layer 12. Following formation of dielectric layer 112, a planarization process is used to remove portions of dielectric layer 112 and to planarize the surface of CNT layer 12. As shown in FIG. 4F, the planarization step exposes dielectric layer 58b and portions of CNT layer 12 that remain within features 136. For example, dielectric layer 112 and CNT layer 12 may be planarized using CMP or an etchback process. The portion of CNT layer 12 that remains in features 136 will form reversible resistance-switching element 12. As shown in FIG. 4F, after planarization, voids within CNT layer 12 remain substantially filled with dielectric material 112.

Figure 4G:
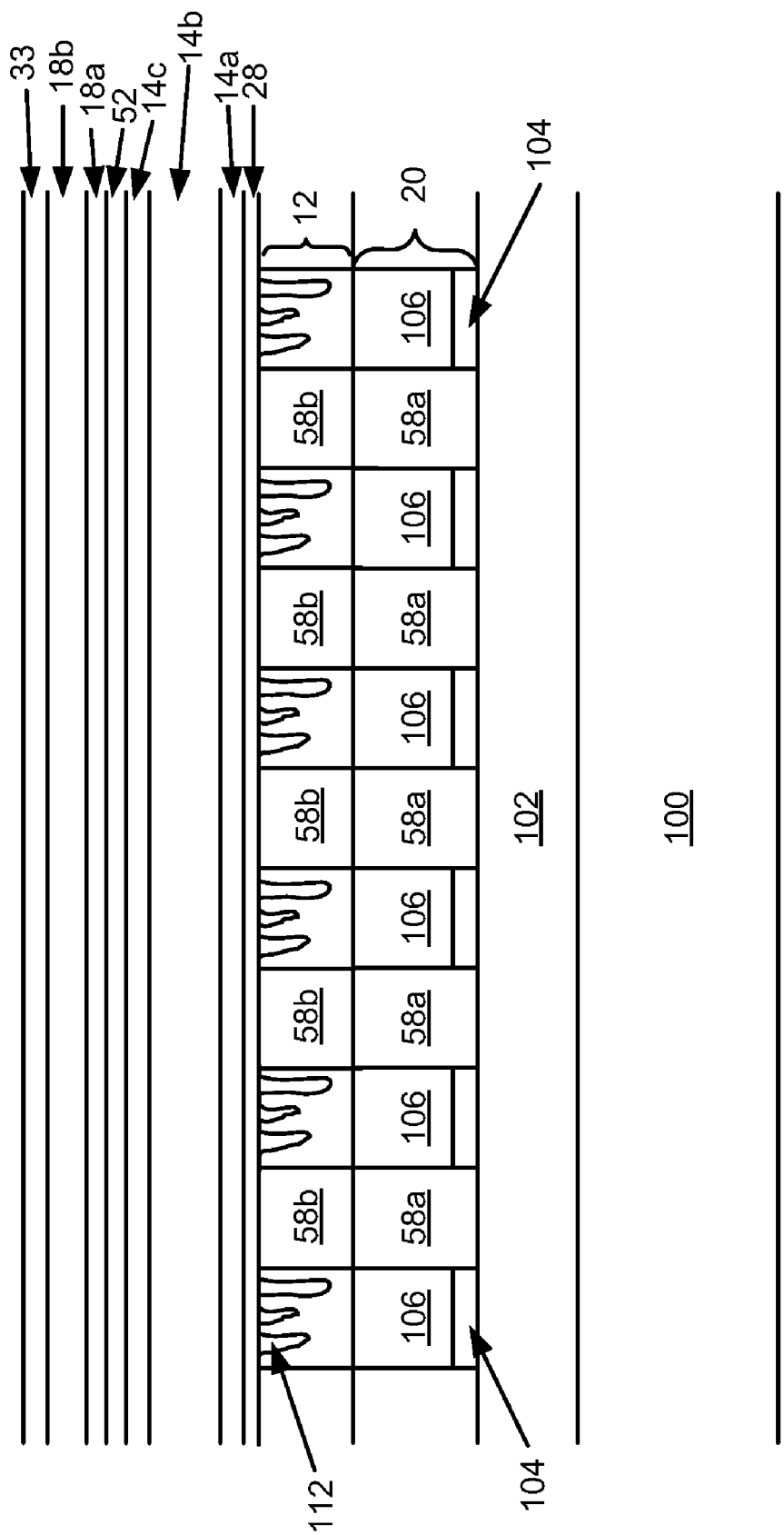

The diode structures of each memory cell are now formed. With reference to FIG. 4G, a barrier layer 24 is formed above reversible resistance switching element 12 and dielectric layer 58b. Barrier layer 24 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 24, deposition of the semiconductor material used to form the diode of each memory cell begins (e.g., diode 14 in FIGS. 2A and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference again to FIG. 4G, following formation of barrier layer 24, a heavily doped n+ silicon layer 14a is deposited on barrier layer 24. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm$^-$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b is formed over n+ silicon layer 14a. In some embodiments, intrinsic silicon layer 14b is in an amorphous state as deposited. In other embodiments, intrinsic silicon layer 14b is in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to deposition of intrinsic silicon layer 14b to prevent and/or reduce dopant migration from n+ silicon layer 14a into intrinsic silicon layer 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes.

Heavily doped, p-type silicon is either deposited and doped by ion implantation or is doped in situ during deposition to form a p+ silicon layer 14c. For example, a blanket p+ implant may be employed to implant boron a predetermined depth within intrinsic silicon layer 14b. Exemplary implantable molecular ions include BF$_2$, BF$_3$, B and the like. In some embodiments, an implant dose of about 1-5×10$^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used.

A first metal layer 18a, which may include titanium nitride, tantalum nitride, tungsten nitride, etc., and a second metal layer 18b which may include tungsten, for example, are formed above silicide-forming metal layer 52. Metal layers 18a and 18b may serve as a hard mask during formation of diode 14. Use of metal hard masks is described, for example, in U.S. patent application Ser. No. 11/444,936, filed May 13, 2006 and titled "Conductive Hard Mask To Protect Patterned Features During Trench Etch" (the "'936 Application") which is hereby incorporated by reference herein in its entirety for all purposes.

A barrier layer 33 is deposited over metal layer 18b. Barrier layer 33 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Figure 4H:
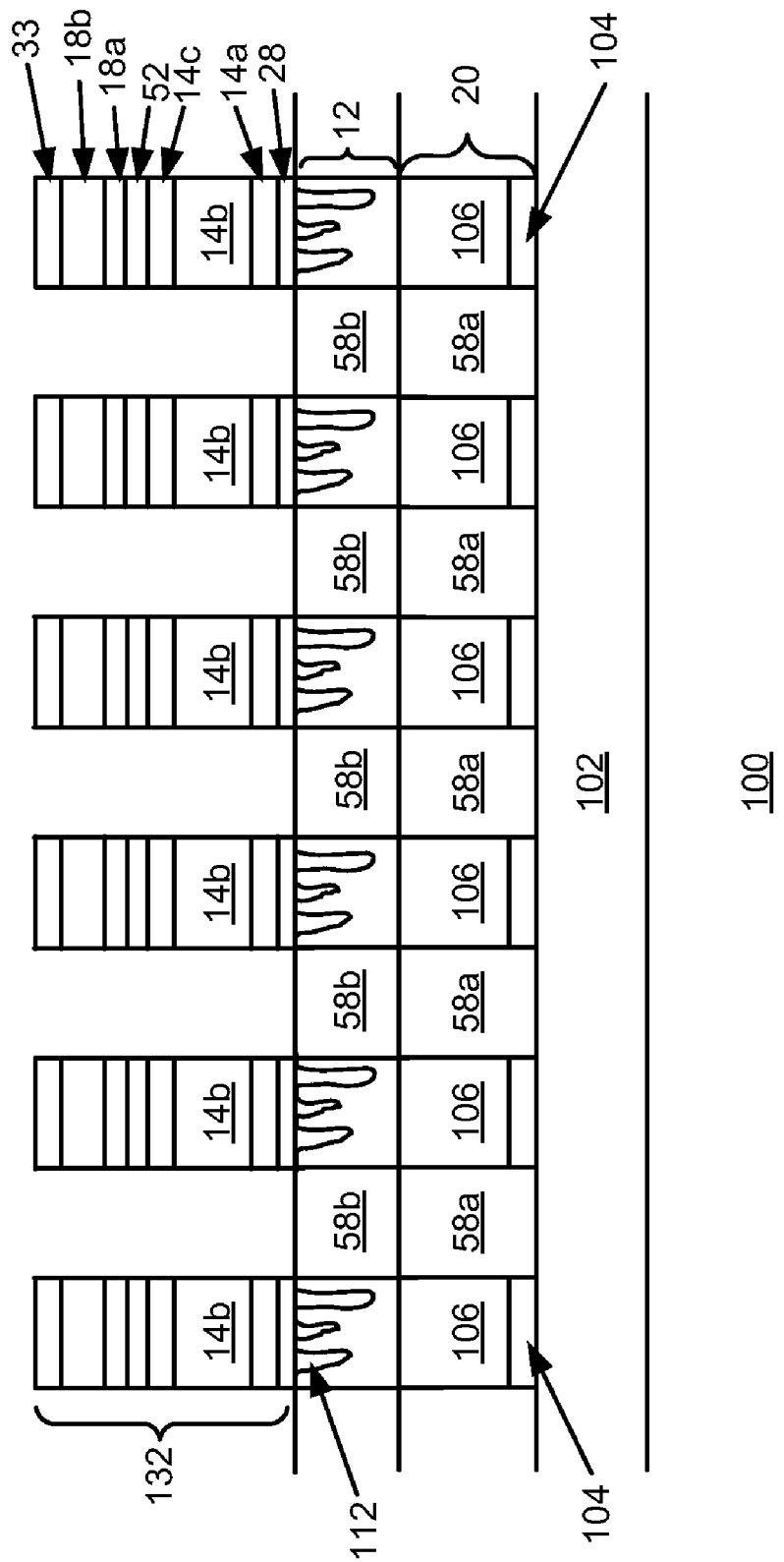
Figure 4I:
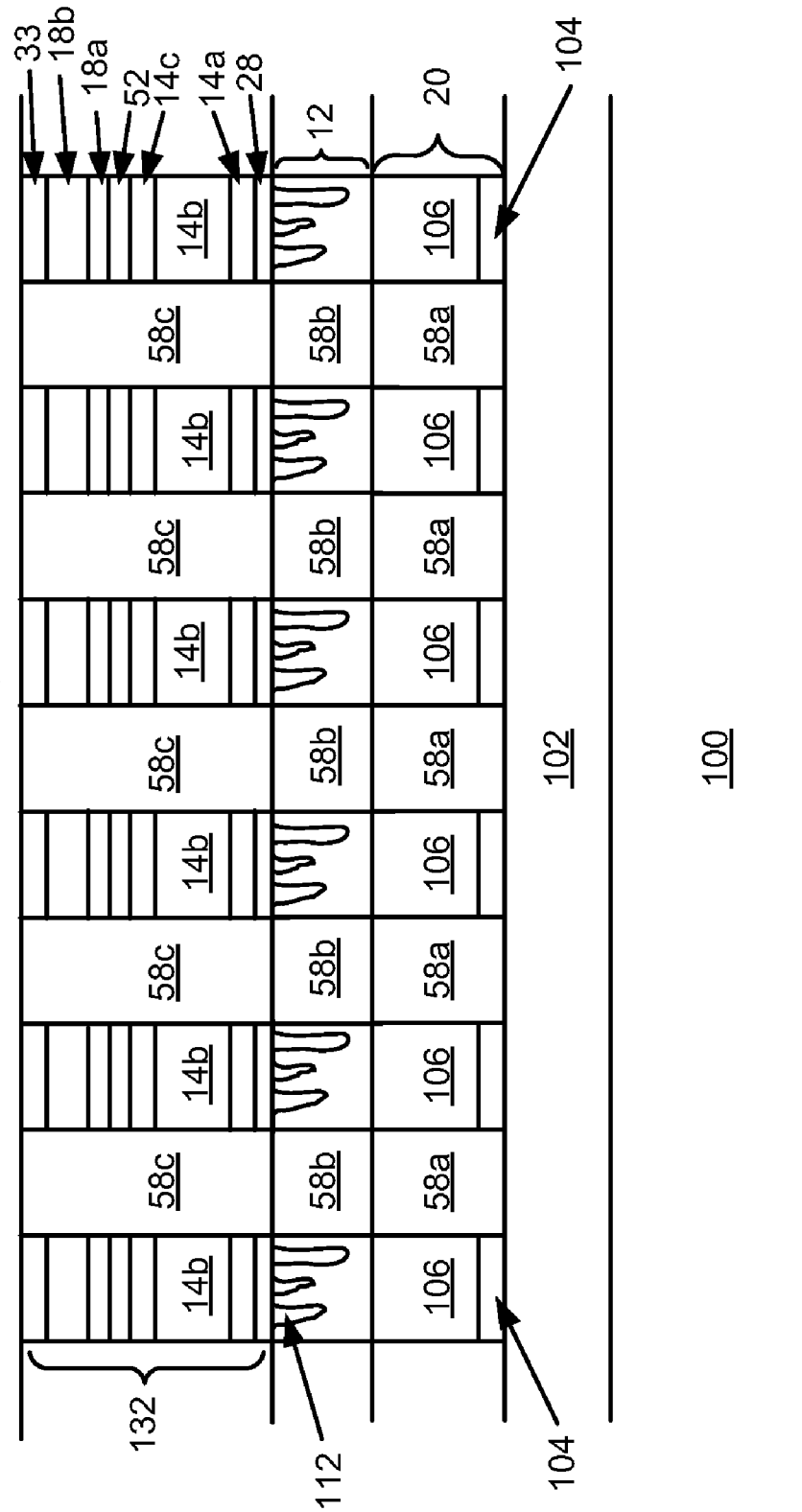

Barrier layer 33, hard mask metal layers 18a-18b, silicide-forming metal layer 52, silicon layers 14a-14c, and barrier layer 24 are then patterned and etched into pillars 132, resulting in the structure shown in FIG. 4H. For example, initially, barrier layer 33 and hard mask metal layers 18a-18b are etched. The etch continues, etching silicide-forming metal layer 52, silicon layers 14a-c, and barrier layer 24. Barrier layer 33 and hard mask metal layers 18a-18b serve as a hard mask during the silicon etch. A hard mask is an etched layer which serves to pattern the etch of an underlying layer. In this manner, pillars 132 are formed in a single photolithographic step. Conventional lithography techniques, and wet or dry etch processing may be employed to form the pillars 132. In the embodiment illustrated in FIGS. 4A-4J, each pillar 132 includes a p-i-n, downward-pointing diode 14. Upward-pointing p-i-n diodes may be similarly formed.

After the pillars 132 have been formed, a dielectric layer 58c is deposited over pillars 132 to fill the voids between pillars 132. For example, approximately 800 to 4500 angstroms of silicon dioxide may be deposited and then planarized using CMP or an etchback process to form a planar surface, resulting in the structure illustrated in FIG. 4I. The planar surface includes exposed top surfaces of the pillars 132 separated by dielectric material 58c (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4J:
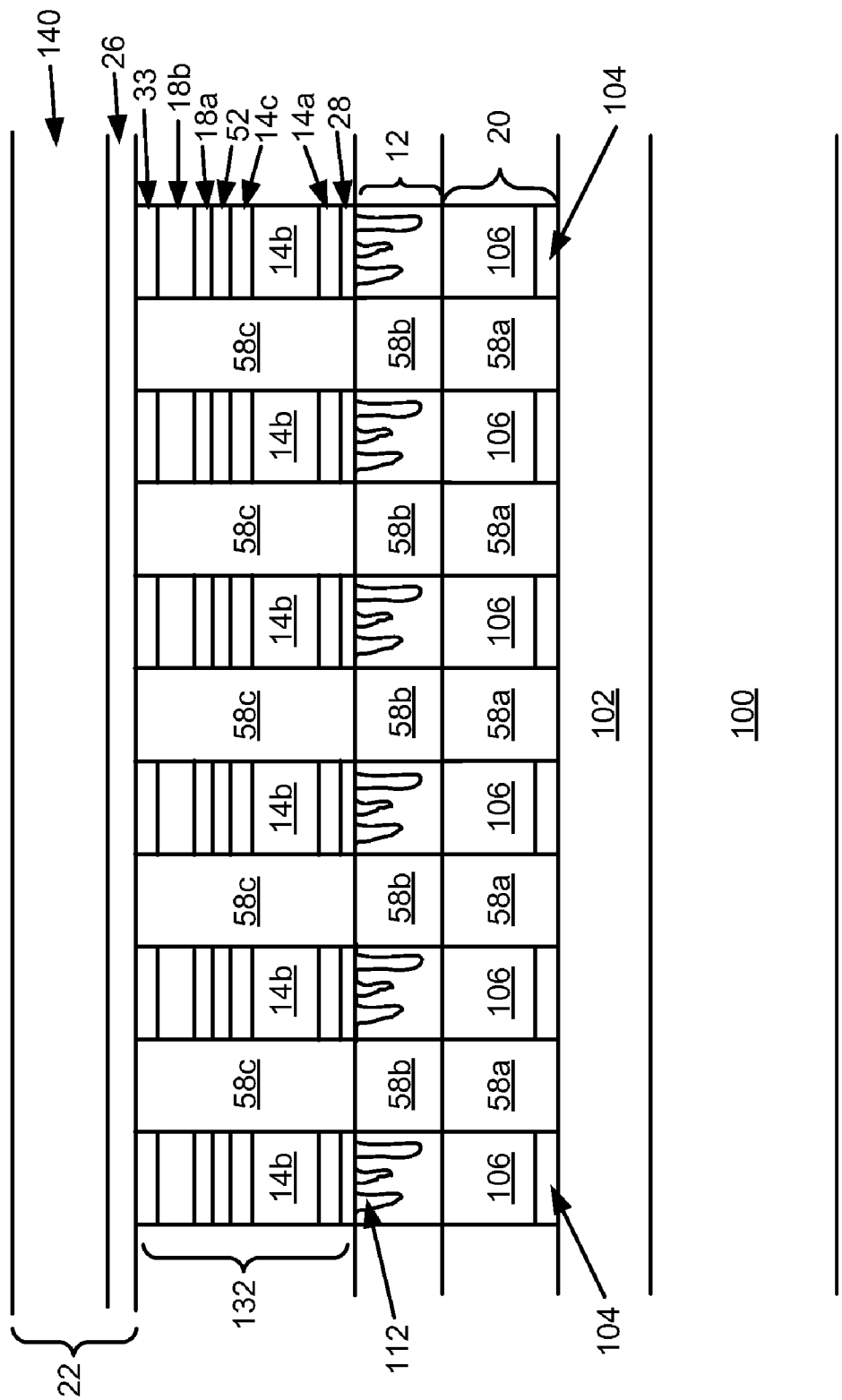

With reference to FIG. 4J, a second set of conductors 22 may be formed above pillars 132 in a manner similar to the formation of the bottom set of conductors 20. For example, as shown in FIG. 4J, in some embodiments, one or more barrier layers and/or adhesion layers 26 may be deposited over pillars 132 prior to deposition of a conductive layer 140 used to form the upper, second set of conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). The deposited conductive layer 140 and barrier and/or adhesion layer 26, may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for second conductors 22. Conductive layer 140 and barrier layer 26 may mitigate the effects of overetching of such a dielectric layer during formation of the openings or voids for second conductors 22, preventing accidental shorting of the diodes 14. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of the diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms the diodes 14 (e.g., changing any amorphous semiconductor material to polycrystalline semiconductor material and/or improving overall crystalline properties of the diodes 14). Lower resistivity diode material thereby is provided.

The foregoing description discloses only exemplary embodiments of the invention. Modifications of the above disclosed apparatus and methods which fall within the scope of the invention will be readily apparent to those of ordinary skill in the art. For instance, in any of the above embodiments, CNT layer 12 may be located above diodes 14.

Accordingly, although the present invention has been disclosed in connection with exemplary embodiments thereof, it should be understood that other embodiments may fall within the spirit and scope of the invention, as defined by the following claims.

The invention claimed is:

1. A method of forming a planar carbon nanotube ("CNT") resistivity switching material for use in a memory cell, the method comprising:
    depositing first dielectric material;
    patterning the first dielectric material;
    etching the first dielectric material to form a feature within the first dielectric material;
    depositing CNT resistivity-switching material over the first dielectric material to fill the feature at least partially with the CNT resistivity-switching material;
    depositing second dielectric material over the CNT resistivity-switching material; and
    planarizing the second dielectric material and the CNT resistivity-switching material to expose at least a portion of the CNT resistivity-switching material within the feature.

2. The method of claim 1, wherein depositing CNT resistivity-switching material over the first dielectric material comprises using a spray-coating technique.

3. The method of claim 1, wherein depositing CNT resistivity-switching material over the first dielectric material comprises using a spin-coating technique.

4. The method of claim 1, wherein depositing CNT resistivity-switching material over the first dielectric material comprises:
    forming a seeding layer above the first dielectric material; and
    forming CNT resistivity-switching material on the seeding layer.

5. The method of claim 1, wherein the CNT resistivity-switching material comprises a surface having a void or valley, and depositing the second dielectric material comprises substantially filling the void or valley.

6. The method of claim 1, further comprising forming a steering element coupled to the CNT resistivity-switching material.

7. A memory cell formed using the method of claim 1.

8. The method of claim 5, wherein after planarization, the void or valley remains substantially filled with the second dielectric material.

9. The method of claim 6, wherein the steering element comprises a thin film transistor.

10. The method of claim 6, wherein the steering element comprises a thin film diode.

11. A method of forming a memory cell, the method comprising:
    forming a feature above a substrate;
    forming a memory element comprising carbon nanotube ("CNT") resistivity-switching material by:
    forming CNT resistivity-switching material in the feature, wherein a surface of the CNT resistivity-switching material comprises a void or valley; and
    forming a dielectric material above the CNT resistivity-switching material, wherein the dielectric material substantially fills the void or valley; and
    forming a steering element above the substrate, wherein the steering element is coupled to the CNT resistivity-switching material.

12. The method of claim 11, further comprising:
    forming a dielectric layer above the substrate; and
    forming the feature in the dielectric layer.

13. The method of claim 11, wherein the memory element comprises a reversible resistance switching element.

14. The method of claim 11, wherein the steering element comprises a p-n or p i n diode.

15. The method of claim 11, wherein the steering element comprises a polycrystalline diode.

16. The method of claim 11, wherein forming the CNT resistivity-switching material comprises using a spray-coating technique.

17. The method of claim 11, wherein forming the CNT resistivity-switching material comprises using a spin-coating technique.

18. The method of claim 11, wherein forming the CNT resistivity-switching material comprises:
    forming a seeding layer above the substrate; and
    forming CNT resistivity-switching material on the seeding layer.

19. The method of claim 11, wherein the steering element comprises one or more layers of silicon, the method further comprising forming one or more metal layers above the steering element.

20. A memory cell formed using the method of claim 11.

21. An array of memory cells formed using the method of claim 11.

22. The method of claim 19, further comprising etching the one or more metal layers and the one or more layers of silicon.

23. A memory cell comprising:
    a feature above a substrate;
    a CNT resistivity-switching material in the feature, wherein a surface of the CNT resistivity-switching material comprises a void or valley;
    a dielectric material above the CNT resistivity-switching material, wherein the dielectric material substantially fills the void or valley; and
    a steering element above the substrate, wherein the steering element is coupled to the CNT resistivity-switching material.

* * * * *